US011183248B1

(12) United States Patent
Sforzin et al.

(10) Patent No.: US 11,183,248 B1
(45) Date of Patent: Nov. 23, 2021

(54) TIMING PARAMETER ADJUSTMENT MECHANISMS

(71) Applicant: Micron Technology, Inc., Boise, ID (US)

(72) Inventors: Marco Sforzin, Cernusco Sul Naviglio (IT); Daniele Balluchi, Cernusco Sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/942,568

(22) Filed: Jul. 29, 2020

(51) Int. Cl.
*G11C 11/34* (2006.01)
*G11C 16/10* (2006.01)
*G11C 16/30* (2006.01)
*G11C 16/32* (2006.01)

(52) U.S. Cl.
CPC .............. *G11C 16/10* (2013.01); *G11C 16/30* (2013.01); *G11C 16/32* (2013.01)

(58) Field of Classification Search
CPC ......... G11C 16/08; G11C 16/10; G11C 16/16; G11C 16/0483; G11C 16/26
USPC ........................................ 365/185.11, 185.24
See application file for complete search history.

(56) References Cited

U.S. PATENT DOCUMENTS 9,224,442 B2 * 12/2015 Dong .................... G06F 3/0629
10,304,558 B2 * 5/2019 Mariani .............. G11C 11/2293

\* cited by examiner

*Primary Examiner* — Son T Dinh
(74) *Attorney, Agent, or Firm* — Holland & Hart LLP

(57) ABSTRACT

Methods, systems, and devices for timing parameter adjustment mechanisms are described. The memory system may receive an access command to access a block of data. Based on receiving the access command, the memory system may determine a parameter (e.g., a timing parameter) associated with accessing the block of data. The timing parameter may indicate a duration between a first time to access a first page of the block of data and a second time to access a second page of the block of data. The memory system may perform an access operation on the block of data based on determining the timing parameter.

25 Claims, 7 Drawing Sheets

TIMING PARAMETER ADJUSTMENT MECHANISMS

BACKGROUND

The following relates generally to one or more systems for memory and more specifically to timing parameter adjustment mechanisms.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

In some access operations, a throughput of a memory system is based on a staggering time between accessing different partitions within a block of data. The staggering time may be a duration of time between a start time of accessing a first partition and a start time of accessing the next partition. In some cases, decreasing the staggering time may increase the throughput and increase the power consumption of the memory system. In other examples, increasing the staggering time may decrease the throughput and decrease the power consumption. In some memory systems, the staggering times may be static and independent of the power available in the memory system and the data pattern of the memory system, thereby preventing an adjustment of the staggering time.

Systems, devices, and techniques are described for a dynamically configurable staggering time between accessing different partitions in a memory system. In some examples, a power parameter may be used to determine a staggering time between accessing different partitions. In other examples, a data pattern (e.g., weight parameter) may be used to determine a staggering time between accessing different partitions. In such cases, the staggering time may be modified based on the power parameter, the data pattern, or both. In some cases, a same staggering time may be used for each different partition when accessing an entire block. In other cases, a different staggering time may be used for accessing each different partition. In such cases, each staggering time may be independent from other staggering times between accessing different partitions.

Such techniques (e.g., adjusting the staggering time based on available power and the user data pattern to write) may result in more data being written or read in the memory system, which may increase the overall performance of the memory system. Modifying the staggering times based on parameters associated with accessing the block of data may decrease the latency for other operations related to the host system and improve read, write, and erase speeds and efficiency.

Features of the disclosure are initially described in the context of a system as described with reference to FIG. 1. Features of the disclosure are described in the context access operations and process flows as described with reference to FIGS. 2-4B. These and other features of the disclosure are further illustrated by and described with reference to an apparatus diagram and process flows that relate to timing parameter adjustment mechanisms as described with reference to FIGS. 5-7.

Figure 1:
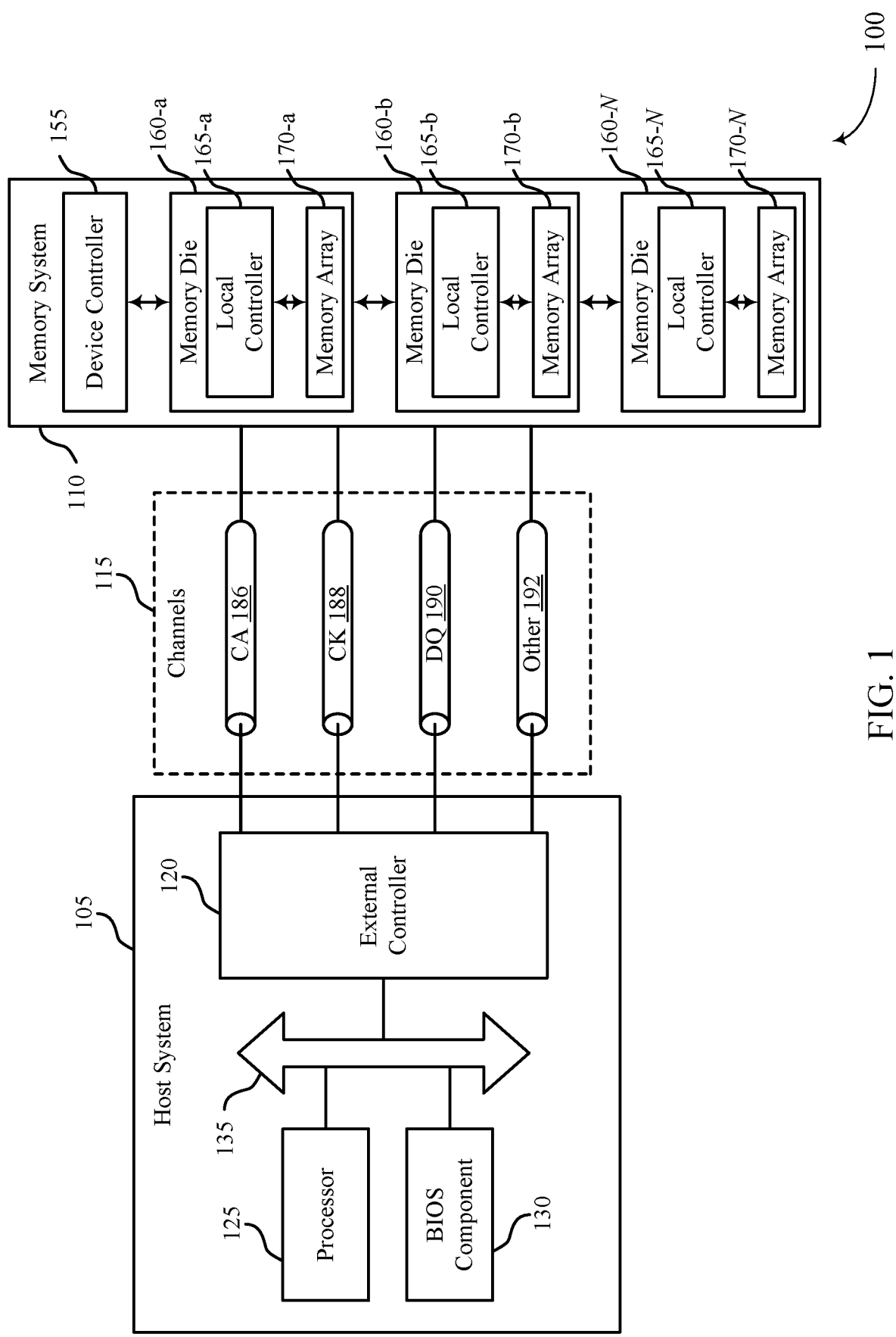
FIG. 1 illustrates an example of a system that supports timing parameter adjustment mechanisms in accordance with examples as disclosed herein.

FIG. 1 illustrates an example of a system 100 that supports timing parameter adjustment mechanisms in accordance with examples as disclosed herein. The system 100 may include a host system 105, a memory system 110, and a plurality of channels 115 coupling the host system 105 with the memory system 110. The system 100 may include one or more memory systems, but aspects of the one or more memory systems 110 may be described in the context of a single memory system (e.g., memory system 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory system 110 may be a component of the system operable to store data for one or more other components of the system 100.

At least portions of the system 100 may be examples of the host system 105. The host system 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host system 105 may refer to the hardware, firmware, software, or a combination thereof that implements the functions of an external controller 120. In some examples, the external controller 120 may be referred to as a host or a host system 105.

A memory system 110 may be an independent device or a component that is operable to provide physical memory addresses/space that may be used or referenced by the system 100. In some examples, a memory system 110 may be configurable to work with one or more different types of host systems 105. Signaling between the host system 105 and the memory system 110 may be operable to support one or more of: modulation schemes to modulate the signals, various pin configurations for communicating the signals, various form factors for physical packaging of the host system 105 and the memory system 110, clock signaling and synchronization between the host system 105 and the memory system 110, timing conventions, or other factors.

The memory system 110 may be operable to store data for the components of the host system 105. In some examples, the memory system 110 may act as a slave-type device to the host system 105 (e.g., responding to and executing commands provided by the host system 105 through the external controller 120). Such commands may include one or more of a write command for a write operation, a read command for a read operation, a refresh command for a refresh operation, or other commands.

The host system 105 may include one or more of an external controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host system 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external controller 120 may be implemented by or be a part of the processor 125.

The BIOS component 130 may be a software component that includes a BIOS operated as firmware, which may initialize and run various hardware components of the system 100 or the host system 105. The BIOS component 130 may also manage data flow between the processor 125 and the various components of the system 100 or the host system 105. The BIOS component 130 may include a program or software stored in one or more of read-only memory (ROM), flash memory, or other non-volatile memory.

The memory system 110 may include a device controller 155 and one or more memory dies 160 (e.g., memory chips) to support a desired capacity or a specified capacity for data storage. Each memory die 160 may include a local controller 165 (e.g., local controller 165-a, local controller 165-b, local controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory system 110 including two or more memory dies may be referred to as a multi-die memory or a multi-die package or a multi-chip memory or a multi-chip package.

The device controller 155 may include circuits, logic, or components operable to control operation of the memory system 110. The device controller 155 may include the hardware, the firmware, or the instructions that enable the memory system 110 to perform various operations and may be operable to receive, transmit, or execute commands, data, or control information related to the components of the memory system 110. The device controller 155 may be operable to communicate with one or more of the external controller 120, the one or more memory dies 160, or the processor 125. In some examples, the device controller 155 may control operation of the memory system 110 described herein in conjunction with the local controller 165 of the memory die 160.

In some examples, the memory system 110 may receive data or commands or both from the host system 105. For example, the memory system 110 may receive a write command indicating that the memory system 110 is to store data for the host system 105 or a read command indicating that the memory system 110 is to provide data stored in a memory die 160 to the host device.

A local controller 165 (e.g., local to a memory die 160) may be operable to control operation of the memory die 160. In some examples, a local controller 165 may be operable to communicate (e.g., receive or transmit data or commands or both) with the device controller 155. In some examples, a memory system 110 may not include a device controller 155, and a local controller 165, or the external controller 120 may perform various functions described herein. As such, a local controller 165 may be operable to communicate with the device controller 155, with other local controllers 165, or directly with the external controller 120, or the processor 125, or a combination thereof. Examples of components that may be included in the device controller 155 or the local controllers 165 or both may include receivers for receiving signals (e.g., from the external controller 120), transmitters for transmitting signals (e.g., to the external controller 120), decoders for decoding or demodulating received signals, encoders for encoding or modulating signals to be transmitted, or various other circuits or controllers operable for supporting described operations of the device controller 155 or local controller 165 or both. In some cases, the local controller 165 may determine the staggering time (e.g., timing parameter) within the memory system 110.

The external controller 120 may be operable to enable communication of one or more of information, data, or commands between components of the system 100 or the host system 105 (e.g., the processor 125) and the memory system 110. The external controller 120 may convert or translate communications exchanged between the components of the host system 105 and the memory system 110. In some examples, the external controller 120 or other component of the system 100 or the host system 105, or its functions described herein, may be implemented by the processor 125. For example, the external controller 120 may be hardware, firmware, or software, or some combination thereof implemented by the processor 125 or other component of the system 100 or the host system 105. Although the external controller 120 is depicted as being external to the memory system 110, in some examples, the external controller 120, or its functions described herein, may be implemented by one or more components of a memory system 110 (e.g., a device controller 155, a local controller 165) or vice versa. In some cases, the external controller 120 may determine the staggering time (e.g., timing parameter) and transmit the staggering time to the memory system 110. In such cases, the external controller 120 may determine the staggering time prior to sending the staggering time to the memory system 110.

The components of the host system 105 may exchange information with the memory system 110 using one or more channels 115. The channels 115 may be operable to support communications between the external controller 120 and the memory system 110. Each channel 115 may be examples of transmission mediums that carry information between the host system 105 and the memory system 110. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host system 105 and one or more pins or pads at the memory system 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

The system 100 may include any quantity of non-transitory computer readable media that support data separation for garbage collection. For example, the host system 105, external controller 120, memory system 110, or memory die 160 may include or otherwise may access one or more non-transitory computer readable media storing instructions (e.g., firmware) for performing the functions ascribed herein to the host system 105, external controller 120, memory system 110, or memory die 160. For example, such instructions, when executed by the host system 105 (e.g., by the host system controller), by the external controller 120, by a memory system 110 (e.g., by a device controller 155), or by a memory die 160 (e.g., by a local controller 165), may cause the host system 105, external controller 120, memory system 110, or memory die 160 to perform associated functions as described herein.

In some cases, memory system 110 may receive an access command to access a block of data. The memory system 110 may determine a parameter associated with accessing the block of data. The parameter may be an example of a power parameter, a data pattern, or a quantity of data available for performing the access operation. The memory system 110 may determine the staggering time (e.g., timing parameter) based on determining the parameter. The staggering time may indicate a duration between a time to access a first page of the block of data and a time to access a second page of the block of data. In some examples, the memory system 110 may perform the access operation on the block of data according to the staggering time. In such cases, each page of the block of data may be accessed according to a same staggering time.

In some examples, the memory system 110 may determine a data pattern for each individual page. In such cases, the memory system 110 may determine a staggering time for each page. The staggering time may indicate a duration between a time to access the current page and a time to access a previous page. The memory system 110 may access the current page after the staggering time expires. In such cases, each page of the block of data may be accessed according to a different staggering time.

By adjusting the staggering time based on a parameter associated with accessing the block of data, the overall performance of the memory system 110 may increase. For example, modifying the staggering time may improve the overall efficiency of the memory system 110, which may result in the memory system 110 experiencing improved read, write, and erase speeds, reduced power consumption, improved processing times, and the like.

Figure 2:
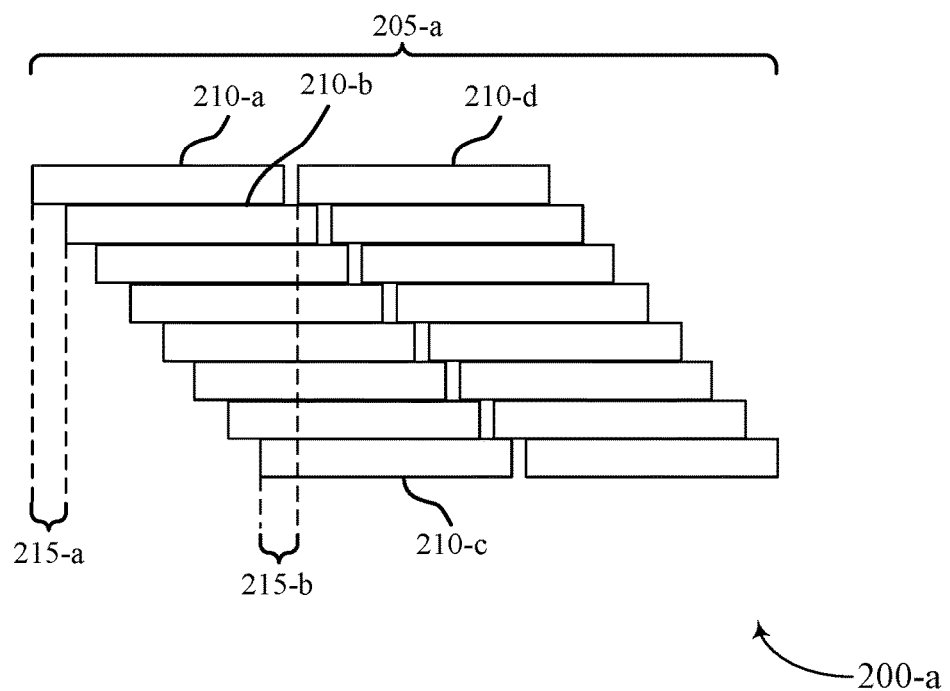
FIG. 2 illustrates examples of access operations that support timing parameter adjustment mechanisms in accordance with examples as disclosed herein.
Figure 2:
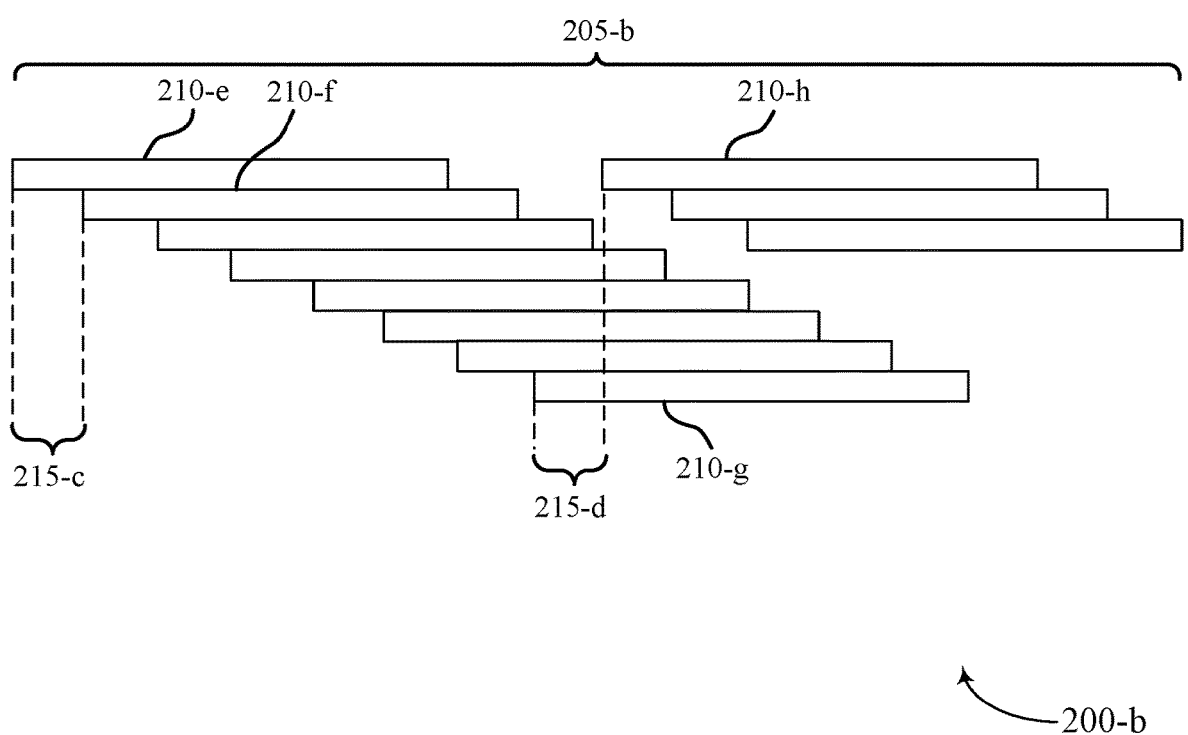

FIG. 2 illustrates an example of an access operation 200 that supports timing parameter adjustment mechanisms in accordance with examples as disclosed herein. The memory system may access a block 205 during the access operation 200. The block 205 may include pages 210. The access operation 200 may include a staggering time 215 (e.g., timing parameter) that indicates a duration between access of each page 210.

The block 205 may include one or more partitions where the partition may be a portion of the memory that may be accessed. A page may be an example of a partition, but other examples of partition are also possible. In some cases, the use of the term "page" may be replaced with a partition or other example of a partition. In some cases, a page 210 within a block may be accessed. In some examples, different pages 210 within the block 205 may be accessed at staggered times (e.g., according to the staggering time 215) as part of the access operation 200. The pages 210 of the block may be read with a staggered time in order to reduce the bit current and power consumption of the memory system.

The throughput of the memory system may at least partially be a function of the staggering time 215. In such cases, the throughput may be a function of a quantity of bits simultaneously read/written from a page 210 in the block 205 and the staggering time 215. If the memory system operates with an increased quantity of power, the throughput may be increased by reducing the staggering time 215. When the staggering time is reduced the quantity of pages being accessed simultaneously or concurrently may be increased. For example, in access operation 200-*a* the staggering time leads to around eight pages being accessed simultaneously while the staggering time in access operation 200-*b* leads to around six pages being accessed simultaneously. The power consumption of the memory system may at least partially be a function of the staggering time 215. For example, the power consumption may increase when the staggering time 215 decreases. In other examples, the power consumption may decrease when the staggering time 215 increases. In some cases, the power consumption may depend on the weight of the data pattern during a write operation. The weight of the pattern may be determined based on the user data pattern, the array pattern, or both.

In some systems, the staggering time 215 may be set prior to the access operation 200. For example, the staggering time 215 may be a fixed duration for accessing the block 205 during the access operation 200. In such cases, the staggering time 215 may be independent of the power available by the memory system and independent of the user data pattern. The memory system may reduce the power consumption without optimizing the performance at a pre-fixed power availability due to the static staggering time. In some cases, the memory system may simultaneously read from the pages 210 of the block 205. In such cases, the latency of the memory system may accumulate after some or all the pages 210 of the block 205 are read, thereby reducing the efficiency of the memory system.

In some examples, the memory system may adjust the staggering time 215 based on the available power and the user data pattern to write. Dynamically configuring the staggering time 215 (e.g., partition-to-partition delay or page-to-page delay or Tp2p) with respect to the dynamic power consumption in a memory system may improve the efficiency and operations of the memory system, thereby reducing the latency at the end of the access operation. When the memory system receives a command, an entire block of data (e.g., block 205) may be accessed. For example, the memory system may receive an access command, and the memory system may determine a parameter (e.g., power consumption, data write pattern, etc.) associated with accessing the block 205.

The memory system may determine the staggering time 215, which indicates a duration between a time to access a first page 210 of the block 205 and a time to access a second page 210 of the block 205 based on determining the parameter. The staggering time 215 may be fixed for the entire block 205. In such cases, the same staggering time 215 may be used for every duration between accessing each page 210 in the block 205. The memory system may perform an access operation on the block 205 based on determining the staggering time 215.

In some cases, the memory system may access a first partition and then access a second partition after the staggering time 215 expires. For example, the memory system may access a first partition of the block 205 at a first time and determine that the duration associated with the staggering time 215 expires after accessing the first partition. The staggering time 215 may indicate the duration between the first time to access the first partition and a second time to access the second partition. The memory system may access the second partition of the block 205 at the second time based on determining that the duration of the staggering time 215 expires.

Access operation 200-$a$ may be an example of memory system that adjusts the staggering times 215-$a$ and 215-$b$ (e.g., timing parameters) based on a power parameter (e.g., power consumption of the memory system). For example, the memory system may adjust the staggering times 215-$a$ and 215-$b$ to improve (e.g., optimize) the performance of the memory system for the power available. The memory system may determine the power parameter for accessing the block 205-$a$ based on the access command. In such cases, the memory system may determine the staggering times 215-$a$ and 215-$b$ based on the power parameter. The power parameter may be determined based on a quantity of clock cycles.

In some cases, the memory system may determine the staggering times 215-$a$ and 215-$b$ by looking up the determined power parameter in a table and matching the power parameter to the staggering times 215-$a$ and 215-$b$. For example, the memory system may determine a mapping between the power parameter and the staggering times 215-$a$ and 215-$b$ based on determining the power parameter. Access operation 200-$a$ may be an example of an access operation with a constant power parameter (e.g., a same power parameter for accessing each page 210).

In some examples, the memory system may receive information associated with the power available for the memory system. A controller or other component of the memory system may transmit the information associated with the power available. For example, a controller may assign and communicate a power budget to the memory system where the power budget may change with respect to time. By communicating the dynamic power budget to the memory system, the memory system may adaptively configure the staggering times 215-$a$ and 215-$b$, thereby reducing the cost of the memory system. The memory system performance at a fixed power consumption may be improved (e.g., optimized) by modifying the staggering times 215-$a$ and 215-$b$ as a function of the user data pattern.

In some cases, the memory system may adjust the staggering times 215-$a$ and 215-$b$ based on the power limit. For example, the memory system may determine whether the power parameter satisfies a threshold. In such cases, the memory system may increase the staggering times 215-$a$ and 215-$b$ if the power limit is low and decrease the staggering times 215-$a$ and 215-$b$ if the power limit is high. For example, the memory system may increase the duration of the staggering times 215-$a$ and 215-$b$ based on determining that the power parameter is below the threshold or decrease the duration of the staggering times 215-$a$ and 215-$b$ based on determining that the power parameter is above the threshold. The staggering times 215-$a$ and 215-$b$ may decrease as the power parameter increases. In such cases, the memory system may operate at increased performance speeds by consuming increased quantities of power.

The staggering times 215-$a$ and 215-$b$ may be fixed for the entire block 205-$a$. For example, the staggering times 215-$a$ and 215-$b$ may be the same staggering time. In such cases, the same staggering time 215 may be used for every duration between accessing each page 210 in the block 205-$a$. For example, the memory system may access a first page 210-$a$ of the block 205-$a$ at a first time and determine that the duration associated with the staggering time 215-$a$ expires after accessing the first page 210-$a$. The memory system may then access the second page 210-$b$ of the block 205-$a$ at a second time based on determining that the duration of the staggering time 215-$a$ expires. In other examples, the memory system may access an eighth page 210-$c$ of the block 205-$a$ and determine that the duration associated with the staggering time 215-$b$ expires after accessing the eighth page 210-$c$. The memory system may then access the ninth page 210-$d$ of the block 205-$a$ based on determining that the duration of the staggering time 215-$b$ expires.

Access operation 200-$b$ may be an example of memory system that adjusts the staggering times 215-$c$ and 215-$d$ (e.g., timing parameter) based on a weight of the data write pattern (e.g., data pattern). For example, the memory system may adjust the staggering times 215-$c$ and 215-$d$ to improve (e.g., optimize) the performance of the memory system for the determined weight of the data write pattern. The memory system may determine the weight of the data write pattern for accessing the block 205-$b$ based on the access command. In such cases, the memory system may determine the staggering times 215-$c$ and 215-$d$ based on the weight of the data write pattern. Access operation 200-$b$ may be an example of an access operation with a constant user data pattern (e.g., a same weight of the data write pattern for each page 210). In some examples, a weight of the data write pattern may be determined based on the quantity of '1s' (or '0s' as the case may be) in the data write pattern. For example, if the data write pattern is 1011001011100100, the weight may be eight (8). In some examples, a weight of the data write pattern may be determined with reference to the data already stored in the memory cells. For example, if the data write pattern is 1011001011100100 and data already stored in the memory cells being written is 0010011101010101, the weight may be four (4) because only four '1s' are written in place of existing '0s'.

The weight of the data write pattern may be an example of a quantity of logic 1's written in the pattern. For example, the memory system may write the pattern over a quantity of logic 0's. The memory system may count the weight of the block 205-b (e.g., count a quantity of logic 1's in the pattern) to determine a quantity of a first type of data accessed in the block 205-b as part of the access operation 200-b. In such cases, the memory system may determine the weight of the data write pattern based on determining the quantity of the first type of data (e.g., a quantity of logic 1's).

In some cases, the memory system may adjust the staggering times 215-c and 215-d based on the weight of the data write pattern. For example, the memory system may determine whether the weight of the data write pattern satisfies a threshold. In such cases, the memory system may increase the staggering times 215-c and 215-d if the weight of the data write pattern is high and decrease the staggering times 215-c and 215-d if the weight of the data write pattern is low. For example, the memory system may increase the duration of the staggering times 215-c and 215-d based on determining that the weight of the data write pattern is above the threshold or decrease the duration of the staggering times 215-c and 215-d based on determining that the weight of the data write pattern is below the threshold. In such cases, a small weight of the set of pages 210 of block 205-b may decrease the staggering times 215-c and 215-d while a large weight of the set of pages 210 of block 205-b may increase the staggering times 215-c and 215-d.

The staggering times 215-c and 215-d may be fixed for the entire block 205-b. For example, the staggering times 215-c and 215-d may be the same staggering time. In such cases, the same staggering time 215 may be used for every duration between accessing each page 210 in the block 205-b. The staggering times 215-c and 215-d for accessing block 205-b may be the same as the staggering times 215-a and 215-b for accessing block 205-a. In other examples, the staggering times 215-c and 215-d for accessing block 205-b may be different than the staggering times 215-a and 215-b for accessing block 205-a.

The memory system may access a first page 210-e of the block 205-b at a first time and determine that the duration associated with the staggering time 215-c expires after accessing the first page 210-e. The memory system may then access the second page 210-f of the block 205-b at a second time based on determining that the duration of the staggering time 215-c expires. In other examples, the memory system may access an eighth page 210-g of the block 205-b and determine that the duration associated with the staggering time 215-d expires after accessing the eighth page 210-g. The memory system may then access the ninth page 210-h of the block 205-a based on determining that the duration of the staggering time 215-d expires.

In some examples, the memory system may determine the staggering time 215 based on a quantity of data that is written as part of the write operation. In some cases, the memory system may determine the staggering time 215 based on the quantity of data or the quantity of partitions used during the write operation (e.g., spacing available in the region of the data written). In such cases, the memory system may determine a quantity of data available for performing the access operation 200 on the block 205 based on receiving the access command.

In some cases, the memory system may adjust the staggering time 215 based on the quantity of data available for performing the access operation 200. For example, the memory system may determine whether the quantity of data available satisfies a threshold. In such cases, the memory system may increase the staggering time 215 if the quantity of data available is high and decrease the staggering time 215 if the quantity of data available is low. For example, the memory system may increase the duration of the staggering time 215 based on determining that the quantity of data available is above the threshold or decrease the duration of the staggering time 215 based on determining that the quantity of data available is below the threshold. In such cases, a small quantity of data available for performing the access operation 200 may decrease the staggering time 215 while a large quantity of data available for performing the access operation 200 may increase the staggering time 215.

Figure 3:
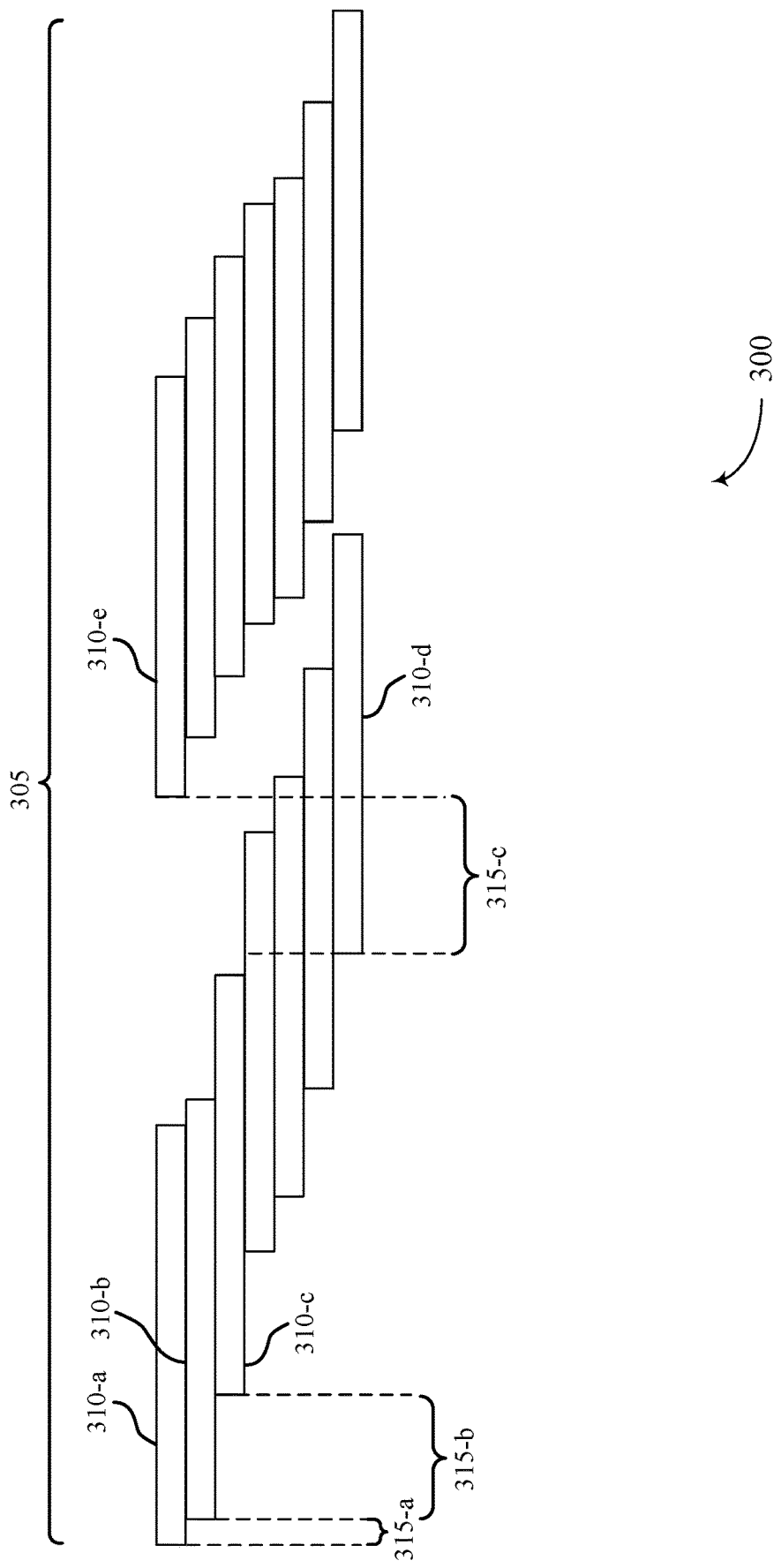
FIG. 3 illustrates an example of an access operation that supports timing parameter adjustment mechanisms in accordance with examples as disclosed herein.

FIG. 3 illustrates an example of an access operation 300 that supports timing parameter adjustment mechanisms in accordance with examples as disclosed herein. The memory system may access a block 305 during the access operation 300. The block 305 may include pages 310. The access operation 300 may include a staggering time 315 (e.g., timing parameter) that indicates a duration between access of each page 310.

The block 305 may include one or more partitions where the partition may be a portion of the memory that may be accessed. In some cases, a page 310 within a block may be accessed. In some examples, different pages 310 in the block 305 may be accessed at staggered times (e.g., according to the staggering time 315) as part of the access operation. For example, access operation 300 may include different staggering times 315 for each individual page 310. In such cases, the weight of the data write pattern for each page 310 may vary.

When the memory system receives a command, an entire block of data (e.g., block 305) may be accessed. For example, the memory system may receive an access command and determine a data write pattern for each page 310 based on the access command. For example, the memory system may determine a weight of the data write pattern for each of pages 310-a, 310-b, 310-c, 310-d, and 310-e. The weight of the data write pattern may be an example a quantity of logic 1's in the pattern. To determine the weight of the data write pattern, the memory system may compare the weight of the data write pattern to the stored pattern of the memory array via an internal component (e.g., controller). For example, the memory system may determine a difference between a pattern of data stored in block 305 and the data write pattern associated with the access command.

In some examples, the memory system may receive a comparison of the data write pattern to the stored pattern in the memory array via an external component (e.g., external controller). For example, the memory system may receive an indication of a difference between the data write pattern and a pattern stored in the block 305 of the memory array based on determining the data write pattern. In such cases, the memory system may determine the staggering time 315 based on determining a difference between the stored pattern and the data write pattern.

In some cases, the weight of the data write pattern for each individual page 310 may vary, thereby effecting the variability of the staggering time 315. For example, the weight of the data pattern for page 310-a may be different than the weight of the data pattern for page 310-b. For example, page 310-a may include a quantity of logic 1's less than a quantity of logic 1's included in page 310-b. In such cases, the power consumption associated with accessing page 310-*a* and weight of the data write pattern of page 310-*a* may be less than the power consumption associated with accessing page 310-*b* and the data write pattern of page 310-*b*. In other examples, the weight of the data pattern for page 310-*b* may be different than the weight of the data pattern for page 310-*c*. For example, page 310-*c* may include a greater weight of the data write pattern than page 310-*b*.

Based on determining the weight of the data write pattern for each page 310, the memory system may determine a staggering time 315 for each page 310. The staggering time may indicate a duration between a time to access a current page 310 and a time to access a previous page 310. The memory system may access the current page 310 after the duration of the staggering time 315 expires as part of an access operation 300 to access block 305. In such cases, the memory system may access a next page 310 after accessing the current page 310.

For example, the memory system may access page 310-*a* and then access page 310-*b* after the duration of the staggering time 315-*a* expires. The memory system may determine the staggering time 315-*a* during the access operation of page 310-*a*. In such cases, the memory system may determine a lower limit of a duration (e.g., a minimum duration) of the staggering time 315-*a* to allow time for determining the staggering time 315-*a* prior to the completion of the access operation 300 on page 310-*a*. During the access operation 300, the memory system may determine the staggering time 315, thereby preventing a delay for the access operation 300.

After the memory system accesses page 310-*b*, the memory system may access page 310-*c* based on the duration of staggering time 315-*b* expiring. The access operation 300 associated with accessing page 310-*c* may refrain from starting if the access operation 300 on page 310-*b* is not complete (e.g., page 310-*b* is not free from an access operation 300). In such cases, the memory system may determine that the access operation 300 on the previous page 310-*b* is complete and that the staggering time 315-*b* is expired, and then the memory system may start the access operation 300 on page 310-*c* based on determining that access operation on page 310-*b* is complete.

The staggering time 315 may be a different duration between each page 310 in the block 305. For example, the duration indicated by each staggering time 315 associated with each page 310 may be independently configured from other staggering times 315 associated with other pages 310 of the block 305. For example, staggering time 315-*a* may be configured independently of staggering time 315-*b* which may be configured independently of staggering time 315-*c*. The staggering time 315-*a* between accessing page 310-*a* and page 310-*b* may be less than the staggering time 315-*b* between accessing page 310-*b* and page 310-*c*. In other examples, the staggering time 315-*c* between accessing page 310-*d* and page 310-*e* may be greater than the staggering time 315-*b* and greater than the staggering time 315-*a*.

In some cases, the memory system may adjust the staggering time 315 of each page 310 based on the weight of the data write pattern. For example, the memory system may determine whether the weight of the data write pattern satisfies a threshold. In such cases, the memory system may increase the staggering time 315 if the weight of the data write pattern is high and decrease the staggering time 315 if the weight of the data write pattern is low. For example, the memory system may increase the duration of the staggering time 315 based on determining that the weight of the data write pattern is above the threshold or decrease the duration of the staggering time 315 based on determining that the weight of the data write pattern is below the threshold.

Dynamically configuring the staggering time 315 for each page 310 with respect to the weight of the data write pattern may improve the efficiency and operations of the memory system, as described with reference to FIG. 2. In such cases, the memory system may adjust the staggering time 315 for each page 310 independently of the staggering time 315 of the previous page 310 or the next page 310. By adaptively configuring the staggering time 315 for each page 310, the performance of the memory system may be improved (e.g., optimized) by modifying the individual staggering times 315 as a function of the weight of the data write pattern, as described with reference to FIG. 2.

Figure 4A:
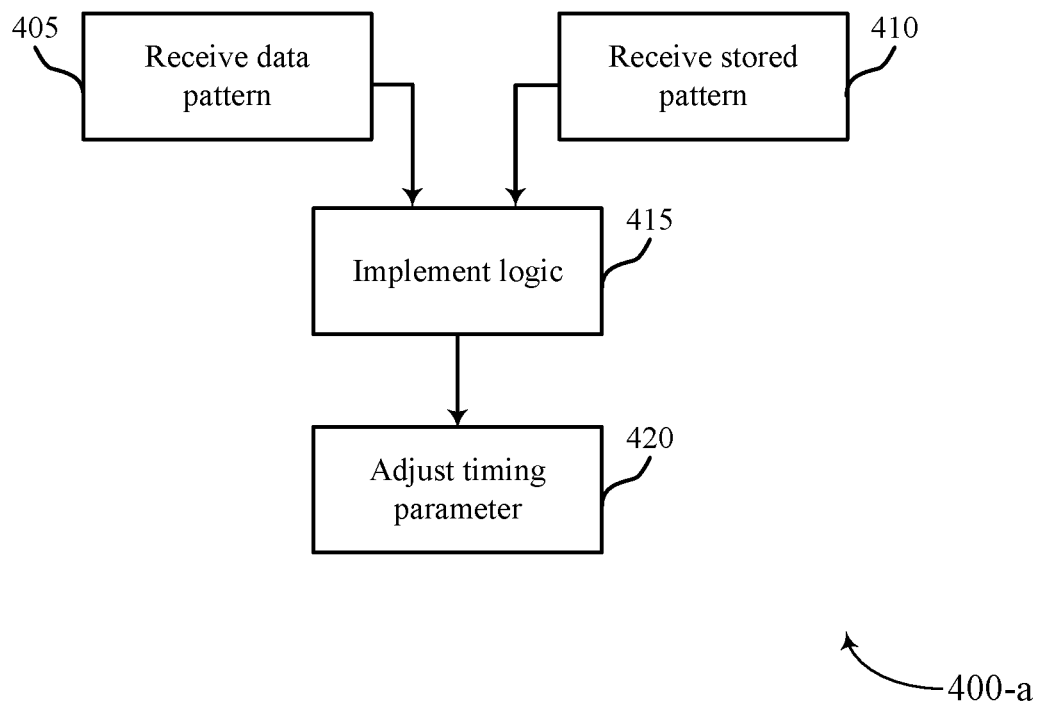
FIG. 4A illustrates an example of a process flow that supports timing parameter adjustment mechanisms in accordance with examples as disclosed herein.

FIG. 4A illustrates an example of a process flow 400-*a* that supports timing parameter adjustment mechanisms in accordance with examples as disclosed herein. The operations of process flow 400-*a* may be implemented by a memory system or its components as described herein. For example, the operations of process flow 400-*a* may be performed by a memory system 110 as described with reference to FIG. 1. Although the process is described below as being performed by memory system 110, in some examples the process flow 400-*b* may be implemented as instructions stored in memory (e.g., firmware stored in 120 or 125). For example, the instructions, when executed by a controller (e.g., 115), may cause the controller to perform the operations of process flow 400-*b*. The process flow 400-*a* may be applied for access operations associated with write operations and read operations.

At 405, the data pattern may be received. For example, the memory system may receive the data pattern (e.g., weight of the data write pattern) associated with the access command. The weight of the data write pattern may be an example of a quantity of logic 1's written in the pattern. For example, the memory system may write the pattern over a quantity of logic 0's. The memory system may count the weight of the block (e.g., count a quantity of logic 1's in the pattern) to determine a quantity of a first type of data accessed in the block as part of the access operation. In such cases, the memory system may determine the weight of the data write pattern based on determining the quantity of the first type of data (e.g., a quantity of logic 1's).

At 410, the data pattern stored in the block of data may be received. For example, the memory system may receive the data pattern stored in the block of data. The data pattern stored in the block may be an example of a data write pattern previously written to the memory system. At 415, the logic may be implemented. For example, the memory system may implement logic to compare the weight of the data write pattern to the stored pattern of the memory array. The memory system may determine a difference between a pattern of data stored in the block of data of the memory array and the data write pattern associated with the access command. In some cases, the logic may be internal to the memory system or external to the memory system. If the logic is external to the memory system, the comparison may be transmitted to the memory system. In some examples, a weight of the data write pattern may be determined with reference to the data already stored in the memory cells. For example, if the data write pattern is 1011001011100100 and data already stored in the memory cells being written is 0010011101010101, the weight may be four (4) because only four '1s' are written in place of existing '0s'. If a '1' already exists in the stored data then the value may not be written (or rewritten) to the memory cell, and thus may not contribute to the determination of the weight.

The memory system may read from the memory array and complete a computation using the logic before the memory system determines the current value of the staggering time. For example, the memory system may write to the memory array with a quantity of unknown values, read from the memory system to determine the unknown values, and compare the pattern read with the pattern stored in the memory system. In such cases, the staggering time may be determined.

At 420, the staggering time (e.g. timing parameter) may be adjusted. For example, the memory system may adjust the staggering time based on the comparison. In such cases, the staggering time may be determined based on determining a difference between the stored pattern and the data write pattern. In some examples, based on the comparison of the data write pattern and the pattern already written in the memory array, the power consumption for writing the data pattern may be a high power consumption or a low power consumption. In such cases, the memory system may adjust the staggering time based on the pattern comparison and the power consumption. Process flow 400-*a* may be implemented for access operations as described with reference to FIG. 3.

Figure 4B:
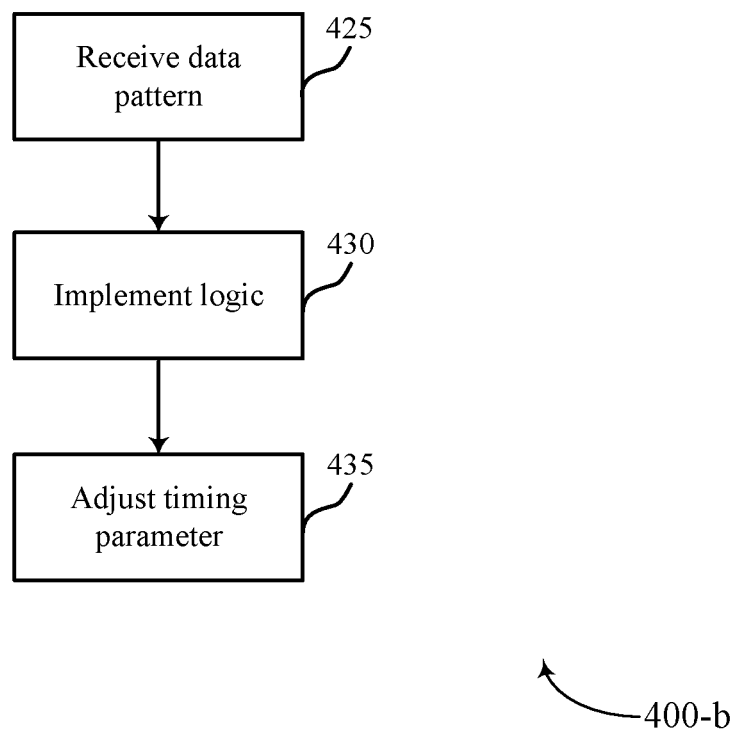
FIG. 4B illustrates an example of a process flow that supports timing parameter adjustment mechanisms in accordance with examples as disclosed herein.

FIG. 4B illustrates an example of a process flow 400-*b* that supports timing parameter adjustment mechanisms in accordance with examples as disclosed herein. The operations of process flow 400-*b* may be implemented by a memory system or its components as described herein. For example, the operations of process flow 400-*b* may be performed by a memory system 110 as described with reference to FIG. 1. Although the process is described below as being performed by memory system 110, in some examples the process flow 400-*b* may be implemented as instructions stored in memory (e.g., firmware stored in 120 or 125). For example, the instructions, when executed by a controller (e.g., 115), may cause the controller to perform the operations of process flow 400-*b*. The process flow 400-*b* may be applied for access operations associated with write operations and read operations.

At 425, the data pattern may be received. For example, the memory system may receive the data pattern (e.g., weight of the data write pattern) associated with the access command. The weight of the data write pattern may be an example of a quantity of logic 1's written in the pattern. For example, the memory system may write the pattern over a quantity of logic 0's. The memory system may count the weight of the block (e.g., count a quantity of logic 1's in the pattern) to determine a quantity of a first type of data accessed in the block as part of the access operation. In such cases, the memory system may determine the weight of the data write pattern based on determining the quantity of the first type of data (e.g., a quantity of logic 1's). At 425, power consumption information may be received. For example, the memory system may receive power consumption information. The information associated with the power available to the memory system may be supplied by the controller or by another component in the memory system.

At 430, the logic may be implemented. For example, the memory system may implement a logic to determine the weight of the data write pattern. The memory system may determine the data write pattern associated with the access command based on counting a quantity of logic 1's present in the data write pattern. In some examples, the memory system may identify a write operation to write a user data pattern. In such cases, the memory system may determine that a portion of the memory system may be available (e.g., previously written with logic 0's). The memory system may refrain from comparing the user data pattern with a stored data pattern and may determine the weight of the data pattern based on the availability of previously written logic 0's (e.g., counting the quantity of logic 1's written to the logic 0's). In some examples, a weight of the data write pattern may be determined based on the quantity of '1s' (or '0s' as the case may be) in the data write pattern. For example, if the data write pattern is 1011001011100100, the weight may be eight (8).

At 430, the power consumption may be determined. For example, the memory system may determine the power consumption. In some cases, the logic may be internal to the memory system or external to the memory system. If the logic is external to the memory system, the power consumption and data write pattern determinations may be transmitted to the memory system.

At 435, the staggering time (e.g. timing parameter) may be adjusted. For example, the memory system may adjust the staggering time (e.g. timing parameter) based on implementing the logic. In such cases, the staggering time may be determined based on determining the data write pattern, determining the power consumption, or both. In some examples, the power consumption for writing the data pattern may be a high power consumption or a low power consumption based on data write pattern. In such cases, the memory system may adjust the staggering time based on the data write pattern, the power consumption, or both.

In some examples, the staggering time may increase when the power consumption decreases. In other examples, the staggering time may decrease when the power consumption increases (e.g., the memory system performs at increased performance and consumes additional power). Based on the information associated with the power consumption, the memory system may adjust the staggering time to improve the memory system performance for a quantity of power available.

In some cases, the process flow 400-*b* may decrease the cost of access operations associated with the memory system as compared to the process flow 400-*a*. The process flow 400-*b* may include determining the user data pattern without a comparison with the stored data pattern, thereby decreasing the latency and increasing the performance of the memory system. Process flow 400-*b* may be implemented for access operations as described with reference to FIG. 2.

Figure 5:
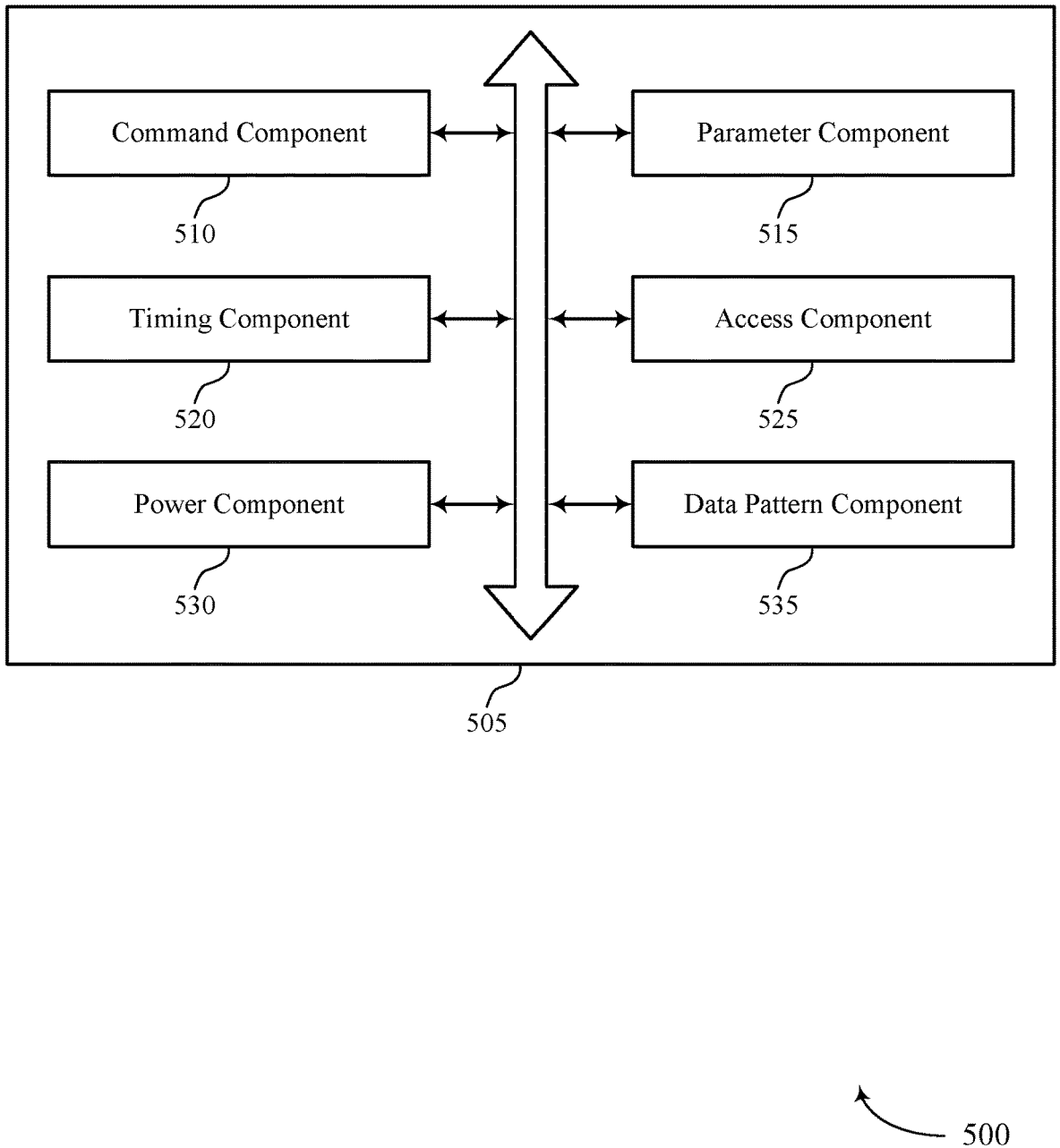
FIG. 5 shows a block diagram of a memory system that supports timing parameter adjustment mechanisms in accordance with examples as disclosed herein.

FIG. 5 shows a block diagram 500 of a memory system 505 that supports timing parameter adjustment mechanisms in accordance with examples as disclosed herein. The memory system 505 may be an example of aspects of a memory system as described with reference to FIGS. 1 through 4. The memory system 505 may include a command component 510, a parameter component 515, a timing component 520, an access component 525, a power component 530, and a data pattern component 535. Each of these modules may communicate, directly or indirectly, with one another (e.g., via one or more buses).

The command component 510 may receive an access command to access a block of data. In some examples, the command component 510 may receive an access command to access a block of data that includes a set of pages.

The parameter component 515 may determine a parameter associated with accessing the block of data based on receiving the access command. In some examples, the parameter component 515 may determine a quantity of data available for performing the access operation on the block of data based on receiving the access command, where determining the timing parameter is based on determining the quantity of data available. In some examples, the parameter component 515 may determine whether the quantity of data available satisfies a threshold based on determining the quantity of data available, where determining the timing parameter is based on determining whether the quantity of data available satisfies the threshold.

The timing component 520 may determine a timing parameter that indicates a duration between a first time to access a first page of the block of data and a second time to access a second page of the block of data based on determining the parameter. In some examples, the timing component 520 may determine a timing parameter for each page of the set of pages that indicates a duration between a first time to access a current page of the set of pages and a second time to access a previous page of the set of pages based on determining the data pattern for each page of the set of pages.

In some examples, the timing component 520 may increase the duration of the timing parameter based on determining that the power parameter is below the threshold. In some examples, the timing component 520 may decrease the duration of the timing parameter based on determining that the power parameter is above the threshold. In some examples, the timing component 520 may increase the duration of the timing parameter based on determining that the data pattern is above the threshold. In some examples, the timing component 520 may decrease the duration of the timing parameter based on determining that the data pattern is below the threshold. In some examples, the timing component 520 may increase the duration of the timing parameter based on determining that the quantity of data available is above the threshold. In some examples, the timing component 520 may decrease the duration of the timing parameter based on determining that the quantity of data available is below the threshold.

In some examples, the timing component 520 may determine that the duration associated with the timing parameter expires after accessing the first page. In some examples, the timing component 520 may determine that a duration associated with the timing parameter expires after accessing the first partition, where the timing parameter indicates the duration between the first time to access the first partition and a second time to access a second partition. In some examples, the duration indicated by the timing parameter is used between accessing each page of the block of data. In some examples, the duration indicated by each timing parameter associated with each page is independently configurable from other durations indicated by other timing parameters associated with other pages of the block of data.

The access component 525 may perform an access operation on the block of data based on determining the timing parameter. In some examples, the access component 525 may access the current page of the set of pages after the duration of the timing parameter expires as part of an access operation to access the block of data.

In some examples, the access component 525 may access the first page of the block of data at the first time. In some examples, the access component 525 may access the second page of the block of data at the second time based on determining that the duration expires. In some examples, the access component 525 may access a first partition of the block of data at a first time. In some examples, the access component 525 may access the second partition of the block of data at the second time based on determining that the duration expires.

In some examples, the access component 525 may access a next page of the set of pages after accessing the current page and after a second duration of the timing parameter of the next page that indicates the second duration a third time to access the next page of the set of pages and the first time to access the current page of the set of pages.

The power component 530 may determine a power parameter for accessing the block of data based on receiving the access command, where determining the timing parameter is based on determining the power parameter, where the parameter includes the power parameter. In some examples, the power component 530 may determine a mapping between the power parameter and the timing parameter based on determining the power parameter, where determining the timing parameter is based on determining the mapping. In some examples, the power component 530 may determine whether the power parameter satisfies a threshold, where determining the timing parameter is based on determining whether the power parameter satisfies the threshold.

The data pattern component 535 may determine a data pattern for each page of the set of pages based on receiving the access command. In some examples, the data pattern component 535 may determine a data pattern for the access operation based on receiving the access command, where determining the timing parameter is based on determining the data pattern, where the parameter includes the data pattern.

In some examples, the data pattern component 535 may determine a quantity of a first type of data accessed in the block of data as part of the access operation based on receiving the access command, where determining the data pattern is based on determining the quantity of the first type of data, where the data pattern includes the quantity of the first type of data. In some examples, the data pattern component 535 may determine whether the data pattern satisfies a threshold based on determining the data pattern, where determining the timing parameter is based on determining whether the data pattern satisfies the threshold.

In some examples, the data pattern component 535 may determine a difference between a pattern of data stored in the block of data of the memory array and the data pattern associated with the access command based on determining the data pattern, where determining the timing parameter is based on the difference between the pattern and the data pattern. In some examples, the data pattern component 535 may receive an indication of a difference between the data pattern and a pattern stored in the block of data of the memory array based on determining the data pattern, where determining the timing parameter is based on receiving the indication. In some examples, the data pattern component 535 may determine whether the data pattern satisfies a threshold based on determining the data pattern, where determining the timing parameter is based on determining whether the data pattern satisfies the threshold.

Figure 6:
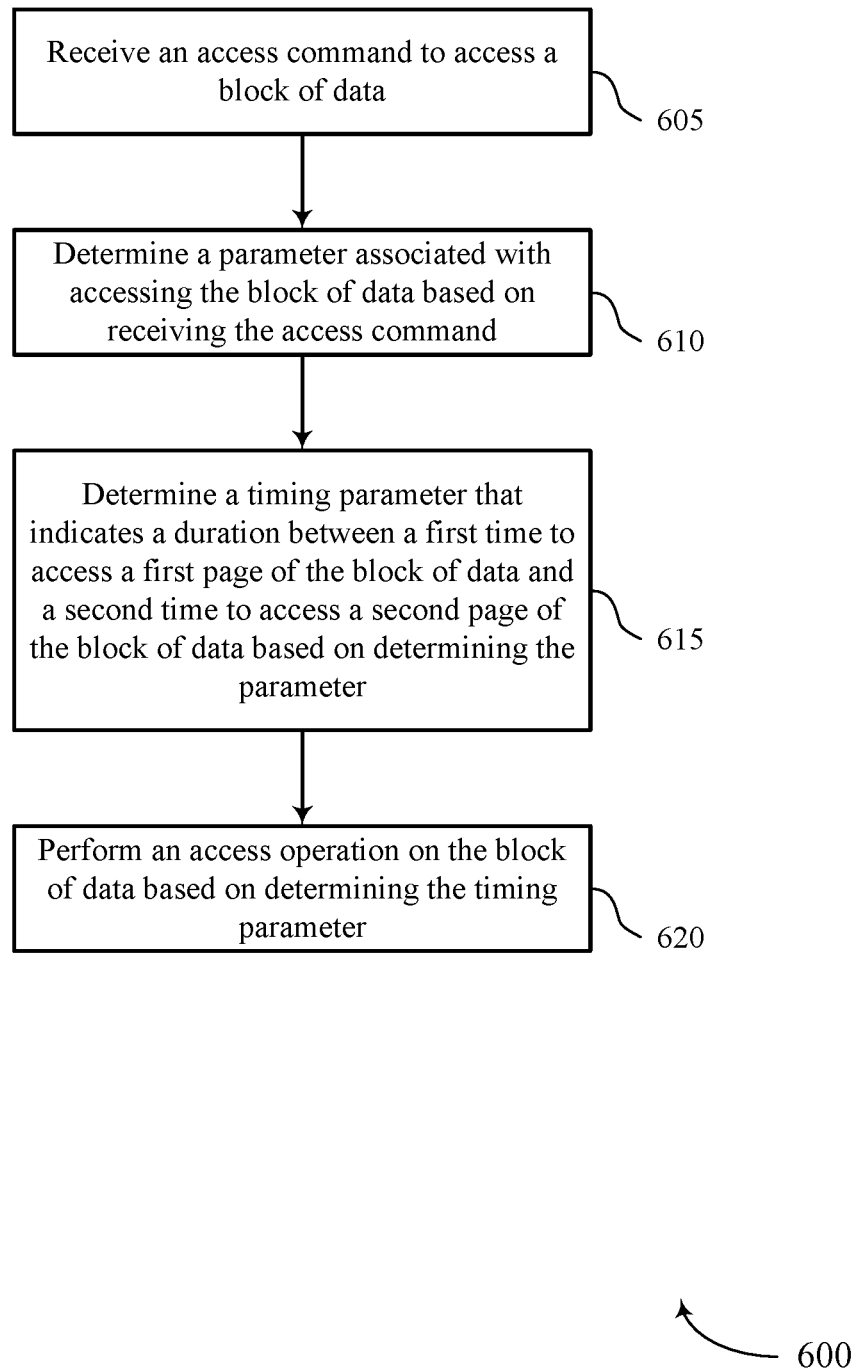
FIGS. 6 and 7 show process flows illustrating a method or methods that support timing parameter adjustment mechanisms in accordance with examples as disclosed herein.

FIG. 6 shows a process flow illustrating a method or methods 600 that supports timing parameter adjustment mechanisms in accordance with examples as disclosed herein. The operations of method 600 may be implemented by a memory system or its components as described herein. For example, the operations of method 600 may be performed by a memory system as described with reference to FIG. 5. In some examples, a memory system may execute a set of instructions to control the functional elements of the memory system to perform the described functions. Additionally or alternatively, a memory system may perform aspects of the described functions using special-purpose hardware.

At 605, an access command to access a block of data may be received. For example, the memory system may receive an access command to access a block of data. The operations of 605 may be performed according to the methods described herein. In some examples, aspects of the operations of 605 may be performed by a command component as described with reference to FIG. 5.

At 610, a parameter associated with accessing the block of data may be determined. For example, the memory system may determine a parameter associated with accessing the block of data based on receiving the access command. The operations of 610 may be performed according to the methods described herein. In some examples, aspects of the operations of 610 may be performed by a parameter component as described with reference to FIG. 5.

At 615, a timing parameter may be determined. For example, the memory system may determine a timing parameter that indicates a duration between a first time to access a first page of the block of data and a second time to access a second page of the block of data based on determining the parameter. The operations of 615 may be performed according to the methods described herein. In some examples, aspects of the operations of 615 may be performed by a timing component as described with reference to FIG. 5.

At 620, an access operation on the block of data may be performed. For example, the memory system may perform an access operation on the block of data based on determining the timing parameter. The operations of 620 may be performed according to the methods described herein. In some examples, aspects of the operations of 620 may be performed by an access component as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for receiving an access command to access a block of data, determining a parameter associated with accessing the block of data based on receiving the access command, determining a timing parameter that indicates a duration between a first time to access a first page of the block of data and a second time to access a second page of the block of data based on determining the parameter, and performing an access operation on the block of data based on determining the timing parameter.

In some examples of the method 600 and the apparatus described herein, determining the parameter further may include operations, features, means, or instructions for determining a power parameter for accessing the block of data based on receiving the access command, where determining the timing parameter may be based on determining the power parameter, where the parameter includes the power parameter.

Some examples of the method 600 and the apparatus described herein may further include operations, features, means, or instructions for determining a mapping between the power parameter and the timing parameter based on determining the power parameter, where determining the timing parameter may be based on determining the mapping.

Some examples of the method 600 and the apparatus described herein may further include operations, features, means, or instructions for determining whether the power parameter satisfies a threshold, where determining the timing parameter may be based on determining whether the power parameter satisfies the threshold.

In some examples of the method 600 and the apparatus described herein, determining whether the power parameter satisfies the threshold further may include operations, features, means, or instructions for increasing the duration of the timing parameter based on determining that the power parameter may be below the threshold or decreasing the duration of the timing parameter based on determining that the power parameter may be above the threshold.

In some examples of the method 600 and the apparatus described herein, determining the parameter further may include operations, features, means, or instructions for determining a data pattern for the access operation based on receiving the access command, where determining the timing parameter may be based on determining the data pattern, where the parameter includes the data pattern.

Some examples of the method 600 and the apparatus described herein may further include operations, features, means, or instructions for determining a quantity of a first type of data accessed in the block of data as part of the access operation based on receiving the access command, where determining the data pattern may be based on determining the quantity of the first type of data, where the data pattern includes the quantity of the first type of data.

Some examples of the method 600 and the apparatus described herein may further include operations, features, means, or instructions for determining whether the data pattern satisfies a threshold based on determining the data pattern, where determining the timing parameter may be based on determining whether the data pattern satisfies the threshold.

In some examples of the method 600 and the apparatus described herein, determining whether the data pattern satisfies the threshold further may include operations, features, means, or instructions for increasing the duration of the timing parameter based on determining that the data pattern may be above the threshold or decreasing the duration of the timing parameter based on determining that the data pattern may be below the threshold.

In some examples of the method 600 and the apparatus described herein, determining the parameter further may include operations, features, means, or instructions for determining a quantity of data available for performing the access operation on the block of data based on receiving the access command, where determining the timing parameter may be based on determining the quantity of data available.

Some examples of the method 600 and the apparatus described herein may further include operations, features, means, or instructions for determining whether the quantity of data available satisfies a threshold based on determining the quantity of data available, where determining the timing parameter may be based on determining whether the quantity of data available satisfies the threshold.

In some examples of the method 600 and the apparatus described herein, determining whether the quantity of data available satisfies the threshold further may include operations, features, means, or instructions for increasing the duration of the timing parameter based on determining that the quantity of data available may be above the threshold or decreasing the duration of the timing parameter based on determining that the quantity of data available may be below the threshold.

In some examples of the method 600 and the apparatus described herein, performing the access operation further may include operations, features, means, or instructions for accessing the first page of the block of data at the first time, determining that the duration associated with the timing parameter expires after accessing the first page, and accessing the second page of the block of data at the second time based on determining that the duration expires.

Some examples of the method 600 and the apparatus described herein may further include operations, features, means, or instructions for accessing a first partition of the block of data at a first time, determining that a duration associated with the timing parameter expires after accessing the first partition, where the timing parameter indicates the duration between the first time to access the first partition and a second time to access a second partition, and accessing the second partition of the block of data at the second time based on determining that the duration expires.

In some examples of the method 600 and the apparatus described herein, the duration indicated by the timing parameter may be used between accessing each page of the block of data.

Figure 7:
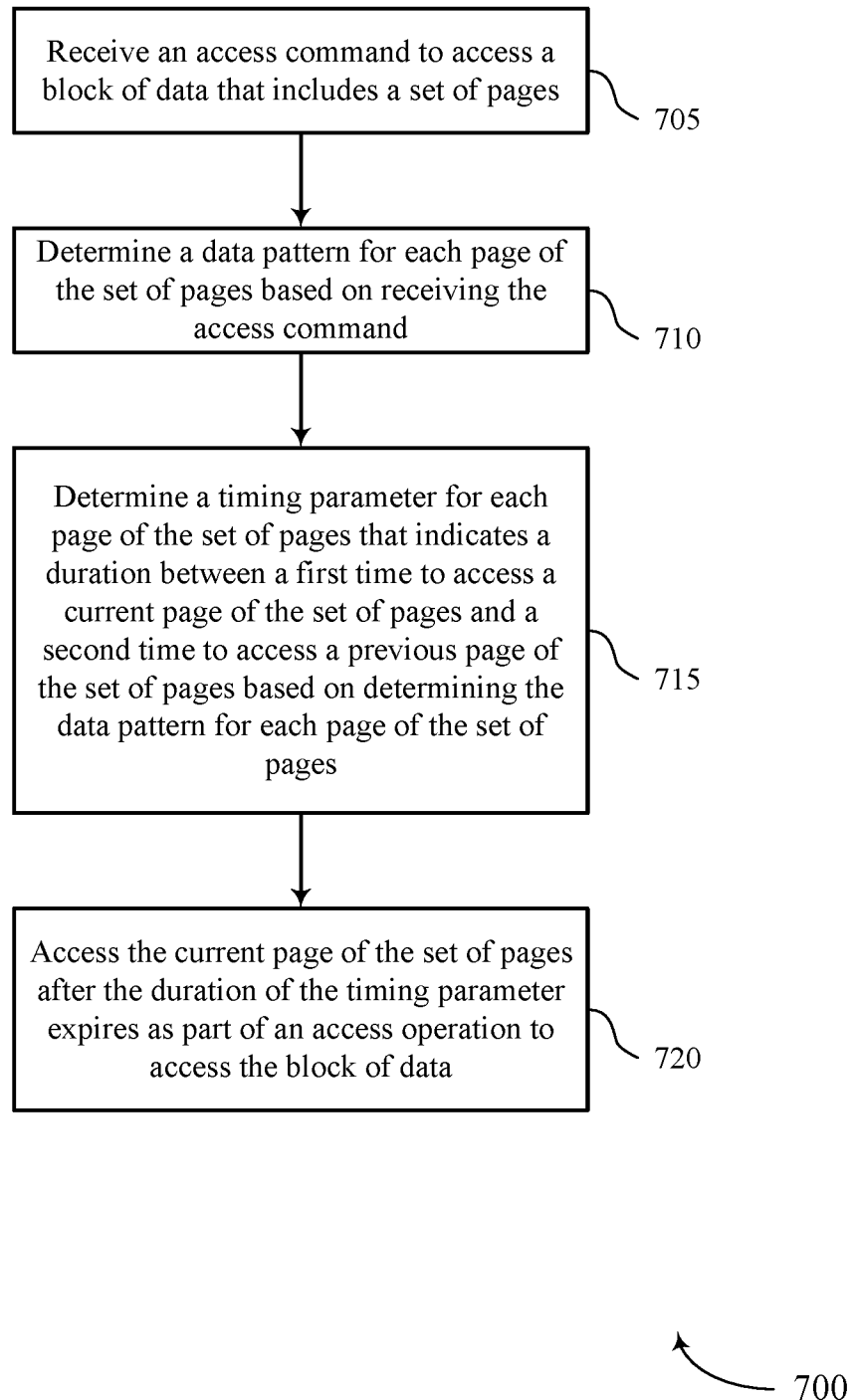

FIG. 7 shows a process flow illustrating a method or methods 700 that supports timing parameter adjustment mechanisms in accordance with examples as disclosed herein. The operations of method 700 may be implemented by a memory system or its components as described herein. For example, the operations of method 700 may be performed by a memory system as described with reference to FIG. 5. In some examples, a memory system may execute a set of instructions to control the functional elements of the memory system to perform the described functions. Additionally or alternatively, a memory system may perform aspects of the described functions using special-purpose hardware.

At 705, an access command to access a block of data may be received. For example, the memory system may receive an access command to access a block of data that includes a set of pages. The operations of 705 may be performed according to the methods described herein. In some examples, aspects of the operations of 705 may be performed by a command component as described with reference to FIG. 5.

At 710, a data pattern for each page of the set of pages may be determined. For example, the memory system may determine a data pattern for each page of the set of pages based on receiving the access command. The operations of 710 may be performed according to the methods described herein. In some examples, aspects of the operations of 710 may be performed by a data pattern component as described with reference to FIG. 5.

At 715, a timing parameter for each page of the set of pages may be determined. For example, the memory system may determine a timing parameter for each page of the set of pages that indicates a duration between a first time to access a current page of the set of pages and a second time to access a previous page of the set of pages based on determining the data pattern for each page of the set of pages. The operations of 715 may be performed according to the methods described herein. In some examples, aspects of the operations of 715 may be performed by a timing component as described with reference to FIG. 5.

At 720, the current page of the set of pages may be accessed. For example, the memory system may access the current page of the set of pages after the duration of the timing parameter expires as part of an access operation to access the block of data. The operations of 720 may be performed according to the methods described herein. In some examples, aspects of the operations of 720 may be performed by an access component as described with reference to FIG. 5.

In some examples, an apparatus as described herein may perform a method or methods, such as the method 700. The apparatus may include features, means, or instructions (e.g., a non-transitory computer-readable medium storing instructions executable by a processor) for receiving an access command to access a block of data that includes a set of pages, determining a data pattern for each page of the set of pages based on receiving the access command, determining a timing parameter for each page of the set of pages that indicates a duration between a first time to access a current page of the set of pages and a second time to access a previous page of the set of pages based on determining the data pattern for each page of the set of pages, and accessing the current page of the set of pages after the duration of the timing parameter expires as part of an access operation to access the block of data.

Some examples of the method 700 and the apparatus described herein may further include operations, features, means, or instructions for accessing a next page of the set of pages after accessing the current page and after a second duration of the timing parameter of the next page that indicates the second duration a third time to access the next page of the set of pages and the first time to access the current page of the set of pages.

Some examples of the method 700 and the apparatus described herein may further include operations, features, means, or instructions for determining a difference between a pattern of data stored in the block of data of the memory array and the data pattern associated with the access command based on determining the data pattern, where determining the timing parameter may be based on the difference between the pattern and the data pattern.

Some examples of the method 700 and the apparatus described herein may further include operations, features, means, or instructions for receiving an indication of a difference between the data pattern and a pattern stored in the block of data of the memory array based on determining the data pattern, where determining the timing parameter may be based on receiving the indication.

Some examples of the method 700 and the apparatus described herein may further include operations, features, means, or instructions for determining whether the data pattern satisfies a threshold based on determining the data pattern, where determining the timing parameter may be based on determining whether the data pattern satisfies the threshold.

In some examples of the method 700 and the apparatus described herein, determining whether the data pattern satisfies the threshold further may include operations, features, means, or instructions for increasing the duration of the timing parameter based on determining that the data pattern may be above the threshold or decreasing the duration of the timing parameter based on determining that the data pattern may be below the threshold.

In some examples of the method 700 and the apparatus described herein, the duration indicated by each timing parameter associated with each page may be independently configurable from other durations indicated by other timing parameters associated with other pages of the block of data.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory array and a controller coupled with the memory array and configured to cause the apparatus to receive an access command to access a block of data, determine a parameter associated with accessing the block of data based on receiving the access command, determine a timing parameter that indicates a duration between a first time to access a first page of the block of data and a second time to access a second page of the block of data based on determining the parameter, and perform an access operation on the block of data based on determining the timing parameter.

Some examples may further include determining a power parameter for accessing the block of data based on receiving the access command, where determining the timing parameter may be based on determining the power parameter, where the parameter includes the power parameter.

Some examples may further include determining a mapping between the power parameter and the timing parameter based on determining the power parameter, where determining the timing parameter may be based on determining the mapping.

Some examples may further include determining whether the power parameter satisfies a threshold, where determining the timing parameter may be based on determining whether the power parameter satisfies the threshold.

Some examples may further include increasing the duration of the timing parameter based on determining that the power parameter may be below the threshold or decreasing the duration of the timing parameter based on determining that the power parameter may be above the threshold.

Some examples may further include determining a data pattern for the access operation based on receiving the access command, where determining the timing parameter may be based on determining the data pattern, where the parameter includes the data pattern.

Some examples may further include determining a quantity of a first type of data accessed in the block of data as part of the access operation based on receiving the access command, where determining the data pattern may be based on determining the quantity of the first type of data, where the data pattern includes the quantity of the first type of data.

Some examples may further include determining whether the data pattern satisfies a threshold based on determining the data pattern, where determining the timing parameter may be based on determining whether the data pattern satisfies the threshold.

Some examples may further include increasing the duration of the timing parameter based on determining that the data pattern may be above the threshold or decreasing the duration of the timing parameter based on determining that the data pattern may be below the threshold.

Some examples may further include determining a quantity of data available for performing the access operation on the block of data based on receiving the access command, where determining the timing parameter may be based on determining the quantity of data available.

Some examples may further include determining whether the quantity of data available satisfies a threshold based on determining the quantity of data available, where determining the timing parameter may be based on determining whether the quantity of data available satisfies the threshold.

Some examples may further include increasing the duration of the timing parameter based on determining that the quantity of data available may be above the threshold or decreasing the duration of the timing parameter based on determining that the quantity of data available may be below the threshold.

Some examples may further include accessing the first page of the block of data at the first time, determining that the duration associated with the timing parameter expires after accessing the first page, and accessing the second page of the block of data at the second time based on determining that the duration expires.

Some examples may further include accessing a first partition of the block of data at a first time, determining that a duration associated with the timing parameter expires after accessing the first partition, where the timing parameter indicates the duration between the first time to access the first partition and a second time to access a second partition, and accessing the second partition of the block of data at the second time based on determining that the duration expires.

In some examples, the duration indicated by the timing parameter may be used between accessing each page of the block of data.

An apparatus is described. The apparatus may include a memory array and a controller coupled with the memory array and configured to cause the apparatus to receive an access command to access a block of data that includes a set of pages, determine a data pattern for each page of the set of pages based on receiving the access command, determine a timing parameter for each page of the set of pages that indicates a duration between a first time to access a current page of the set of pages and a second time to access a previous page of the set of pages based on determining the data pattern for each page of the set of pages, and access the current page of the set of pages after the duration of the timing parameter expires as part of an access operation to access the block of data.

Some examples may further include accessing a next page of the set of pages after accessing the current page and after a second duration of the timing parameter of the next page that indicates the second duration a third time to access the next page of the set of pages and the first time to access the current page of the set of pages.

Some examples may further include determining a difference between a pattern of data stored in the block of data of the memory array and the data pattern associated with the access command based on determining the data pattern, where determining the timing parameter may be based on the difference between the pattern and the data pattern.

Some examples may further include receiving an indication of a difference between the data pattern and a pattern stored in the block of data of the memory array based on determining the data pattern, where determining the timing parameter may be based on receiving the indication.

Some examples may further include determining whether the data pattern satisfies a threshold based on determining the data pattern, where determining the timing parameter may be based on determining whether the data pattern satisfies the threshold.

Some examples may further include increasing the duration of the timing parameter based on determining that the data pattern may be above the threshold or decreasing the duration of the timing parameter based on determining that the data pattern may be below the threshold.

In some examples, the duration indicated by each timing parameter associated with each page may be independently configurable from other durations indicated by other timing parameters associated with other pages of the block of data.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial materials of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus comprising:
   a memory array; and
   a controller coupled with the memory array and configured to cause the apparatus to:
   receive an access command to access a block of data;
   determine a parameter associated with accessing the block of data based at least in part on receiving the access command;
   determine a timing parameter that indicates a duration between a first time to access a first page of the block of data and a second time to access a second page of the block of data based at least in part on determining the parameter; and
   perform an access operation on the block of data based at least in part on determining the timing parameter.

2. The apparatus of claim 1, wherein, to determine the parameter, the controller is configured to cause the apparatus to:
   determine a power parameter for accessing the block of data based at least in part on receiving the access command, wherein determining the timing parameter is based at least in part on determining the power parameter, wherein the parameter comprises the power parameter.

3. The apparatus of claim 2, wherein the controller is further configured to cause the apparatus to:
   determine a mapping between the power parameter and the timing parameter based at least in part on determining the power parameter, wherein determining the timing parameter is based at least in part on determining the mapping.

4. The apparatus of claim 2, wherein the controller is further configured to cause the apparatus to:
   determine whether the power parameter satisfies a threshold, wherein determining the timing parameter is based at least in part on determining whether the power parameter satisfies the threshold.

5. The apparatus of claim 4, wherein, to determine whether the power parameter satisfies the threshold, the controller is configured to cause the apparatus to:
   increase the duration of the timing parameter based at least in part on determining that the power parameter is below the threshold; or
   decrease the duration of the timing parameter based at least in part on determining that the power parameter is above the threshold.

6. The apparatus of claim 1, wherein, to determine the timing parameter, the controller is configured to cause the apparatus to:
   determine a data pattern for the access operation based at least in part on receiving the access command, wherein determining the timing parameter is based at least in part on determining the data pattern, wherein the parameter comprises the data pattern.

7. The apparatus of claim 6, wherein the controller is further configured to cause the apparatus to:
   determine a quantity of a first type of data accessed in the block of data as part of the access operation based at least in part on receiving the access command, wherein determining the data pattern is based at least in part on determining the quantity of the first type of data, wherein the data pattern comprises the quantity of the first type of data.

8. The apparatus of claim 6, wherein the controller is further configured to cause the apparatus to:
   determine whether the data pattern satisfies a threshold based at least in part on determining the data pattern, wherein determining the timing parameter is based at least in part on determining whether the data pattern satisfies the threshold.

9. The apparatus of claim 8, wherein, to determine whether the data pattern satisfies the threshold, the controller is configured to cause the apparatus to:
   increase the duration of the timing parameter based at least in part on determining that the data pattern is above the threshold; or
   decrease the duration of the timing parameter based at least in part on determining that the data pattern is below the threshold.

10. The apparatus of claim 1, wherein, to determine the parameter, the controller is configured to cause the apparatus to:
    determine a quantity of data available for performing the access operation on the block of data based at least in part on receiving the access command, wherein determining the timing parameter is based at least in part on determining the quantity of data available.

11. The apparatus of claim 10, wherein the controller is further configured to cause the apparatus to:
    determine whether the quantity of data available satisfies a threshold based at least in part on determining the quantity of data available, wherein determining the timing parameter is based at least in part on determining whether the quantity of data available satisfies the threshold.

12. The apparatus of claim 11, wherein, to determine whether the quantity of data available satisfies the threshold, the controller is configured to cause the apparatus to:
    increase the duration of the timing parameter based at least in part on determining that the quantity of data available is above the threshold; or
    decrease the duration of the timing parameter based at least in part on determining that the quantity of data available is below the threshold.

13. The apparatus of claim 1, wherein, to perform the access operation, the controller is configured to cause the apparatus to:
    access the first page of the block of data at the first time;
    determine that the duration associated with the timing parameter expires after accessing the first page; and
    access the second page of the block of data at the second time based at least in part on determining that the duration expires.

14. The apparatus of claim 1, wherein the controller is further configured to cause the apparatus to:
  access a first partition of the block of data at a first time;
  determine that a duration associated with the timing parameter expires after accessing the first partition, wherein the timing parameter indicates the duration between the first time to access the first partition and a second time to access a second partition; and
  access the second partition of the block of data at the second time based at least in part on determining that the duration expires.

15. The apparatus of claim 1, wherein the duration indicated by the timing parameter is used between accessing each page of the block of data.

16. An apparatus comprising:
  a memory array; and
  a controller coupled with the memory array and configured to cause the apparatus to:
    receive an access command to access a block of data that comprises a plurality of pages;
    determine a data pattern for each page of the plurality of pages based at least in part on receiving the access command;
    determine a timing parameter for each page of the plurality of pages that indicates a duration between a first time to access a current page of the plurality of pages and a second time to access a previous page of the plurality of pages based at least in part on determining the data pattern for each page of the plurality of pages; and
    access the current page of the plurality of pages after the duration of the timing parameter expires as part of an access operation to access the block of data.

17. The apparatus of claim 16, wherein the controller is further configured to cause the apparatus to:
  access a next page of the plurality of pages after accessing the current page and after a second duration of the timing parameter of the next page that indicates the second duration a third time to access the next page of the plurality of pages and the first time to access the current page of the plurality of pages.

18. The apparatus of claim 16, wherein the controller is further configured to cause the apparatus to:
  determine a difference between a pattern of data stored in the block of data of the memory array and the data pattern associated with the access command based at least in part on determining the data pattern, wherein determining the timing parameter is based at least in part on the difference between the pattern and the data pattern.

19. The apparatus of claim 16, wherein the controller is further configured to cause the apparatus to:
  receive an indication of a difference between the data pattern and a pattern stored in the block of data of the memory array based at least in part on determining the data pattern, wherein determining the timing parameter is based at least in part on receiving the indication.

20. The apparatus of claim 16, wherein the controller is further configured to cause the apparatus to:
  determine whether the data pattern satisfies a threshold based at least in part on determining the data pattern, wherein determining the timing parameter is based at least in part on determining whether the data pattern satisfies the threshold.

21. The apparatus of claim 20, wherein, to determine whether the data pattern satisfies the threshold, the controller is configured to cause the apparatus to:
  increase the duration of the timing parameter based at least in part on determining that the data pattern is above the threshold; or
  decrease the duration of the timing parameter based at least in part on determining that the data pattern is below the threshold.

22. The apparatus of claim 16, wherein the duration indicated by each timing parameter associated with each page is independently configurable from other durations indicated by other timing parameters associated with other pages of the block of data.

23. A non-transitory computer-readable medium storing code comprising instructions, which when executed by a processor of an electronic device, cause the electronic device to:
  receive an access command to access a block of data;
  determine a parameter associated with accessing the block of data based at least in part on receiving the access command;
  determine a timing parameter that indicates a duration between a first time to access a first page of the block of data and a second time to access a second page of the block of data based at least in part on determining the parameter; and
  perform an access operation on the block of data based at least in part on determining the timing parameter.

24. The non-transitory computer-readable medium of claim 23, wherein the instructions, when executed by the processor of the electronic device, further cause the electronic device to:
  determine a power parameter for accessing the block of data based at least in part on receiving the access command, wherein determining the timing parameter is based at least in part on determining the power parameter, wherein the parameter comprises the power parameter.

25. The non-transitory computer-readable medium of claim 23, wherein the instructions, when executed by the processor of the electronic device, further cause the electronic device to:
  determine a data pattern for the access operation based at least in part on receiving the access command, wherein determining the timing parameter is based at least in part on determining the data pattern, wherein the parameter comprises the data pattern.

* * * * *